US010050149B1

(12) United States Patent
Huang et al.

(10) Patent No.: US 10,050,149 B1
(45) Date of Patent: Aug. 14, 2018

(54) GATE STRUCTURE FOR SEMICONDUCTOR DEVICE

(71) Applicant: Taiwan Semiconductor Manufacturing Co., Ltd., Hsinchu (TW)

(72) Inventors: Yu-Lien Huang, Hsinchu County (TW); Tsai-Chun Li, Hsinchu (TW); Ching-Feng Fu, Taichung (TW); Ming-Huan Tsai, Hsinchu County (TW); D. T. Lee, Hsinchu (TW); Cheng-Hua Yang, Zhubei (TW); Yi-Chen Lo, Zhubei (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 15/598,717

(22) Filed: May 18, 2017

(51) Int. Cl.
  *H01L 29/78*    (2006.01)
  *H01L 29/66*    (2006.01)
  *H01L 21/311*   (2006.01)
  *H01L 29/423*   (2006.01)

(52) U.S. Cl.
  CPC .... *H01L 29/7851* (2013.01); *H01L 21/31116* (2013.01); *H01L 29/4232* (2013.01); *H01L 29/6656* (2013.01); *H01L 29/66795* (2013.01)

(58) Field of Classification Search
  CPC ............. H01L 29/7851; H01L 29/4232; H01L 21/31116; H01L 29/66795; H01L 29/6656
  See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 8,816,444 B2 | 8/2014 | Warm et al. | |
| 8,823,065 B2 | 9/2014 | Wang et al. | |
| 8,860,148 B2 | 10/2014 | Hu et al. | |
| 8,963,258 B2 | 2/2015 | Yu et al. | |
| 9,093,530 B2 | 7/2015 | Huang et al. | |
| 9,105,490 B2 | 8/2015 | Wang et al. | |
| 9,171,929 B2 | 10/2015 | Lee et al. | |
| 9,190,488 B1* | 11/2015 | Park | H01L 29/517 |
| 9,214,555 B2 | 12/2015 | Oxland et al. | |
| 9,236,267 B2 | 1/2016 | De et al. | |
| 9,236,300 B2 | 1/2016 | Liaw | |
| 9,397,003 B1* | 7/2016 | Niimi | H01L 21/823418 |
| 9,412,822 B2* | 8/2016 | Cai | H01L 29/1054 |
| 9,520,482 B1 | 12/2016 | Chang et al. | |
| 9,548,303 B2 | 1/2017 | Lee et al. | |
| 9,576,814 B2 | 2/2017 | Wu et al. | |
| 9,685,555 B2* | 6/2017 | Liu | H01L 29/7856 |
| 2011/0065276 A1* | 3/2011 | Ganguly | H01L 21/0223 438/694 |

* cited by examiner

*Primary Examiner* — William Coleman
(74) *Attorney, Agent, or Firm* — Sterne, Kessler, Goldstein & Fox P.L.L.C.

(57) ABSTRACT

A method of forming a semiconductor device includes forming a source/drain region and spacers on a substrate. The method further includes forming an etch stop layer on the spacers and the source/drain region and forming a gate structure between the spacers. The method further includes etching back the gate structure, etching back the spacers and the etch back layer, and forming a gate capping structure on the etched back gate structure, spacers, and etch stop layer.

20 Claims, 12 Drawing Sheets

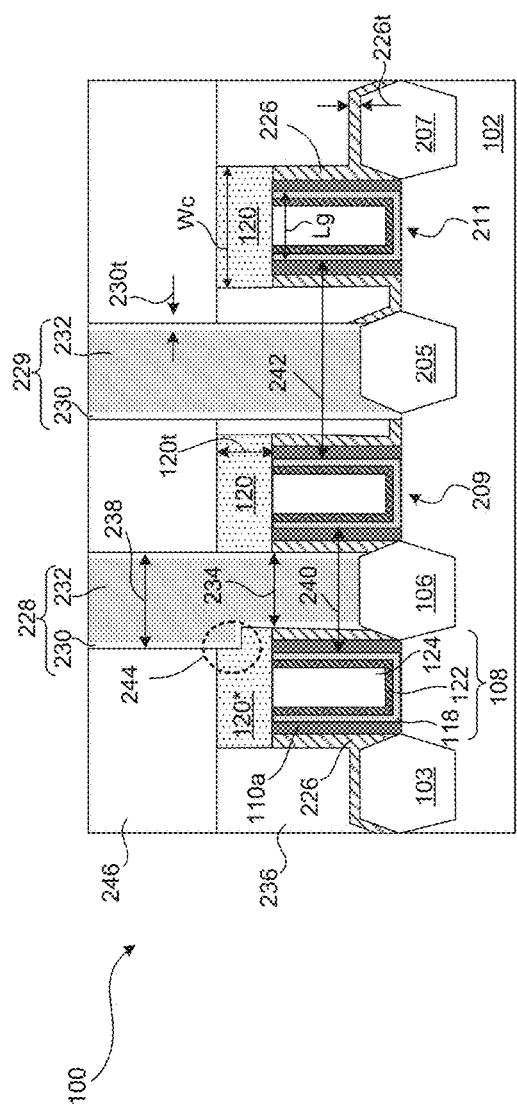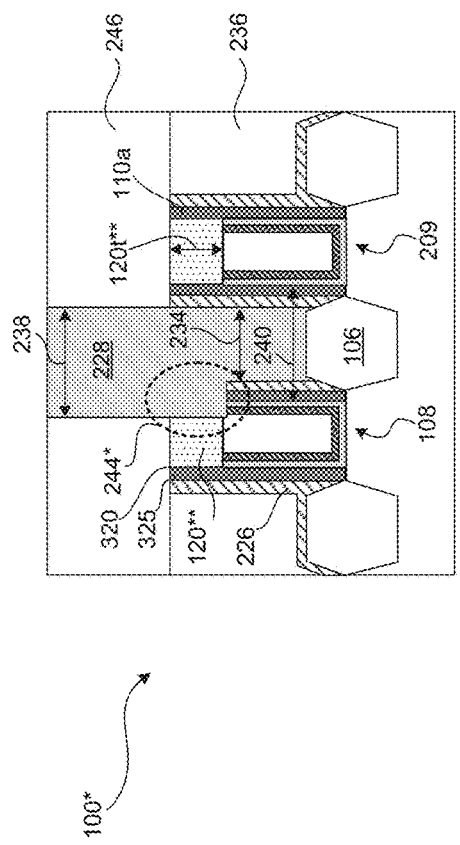
FIG. 2
FIG. 3

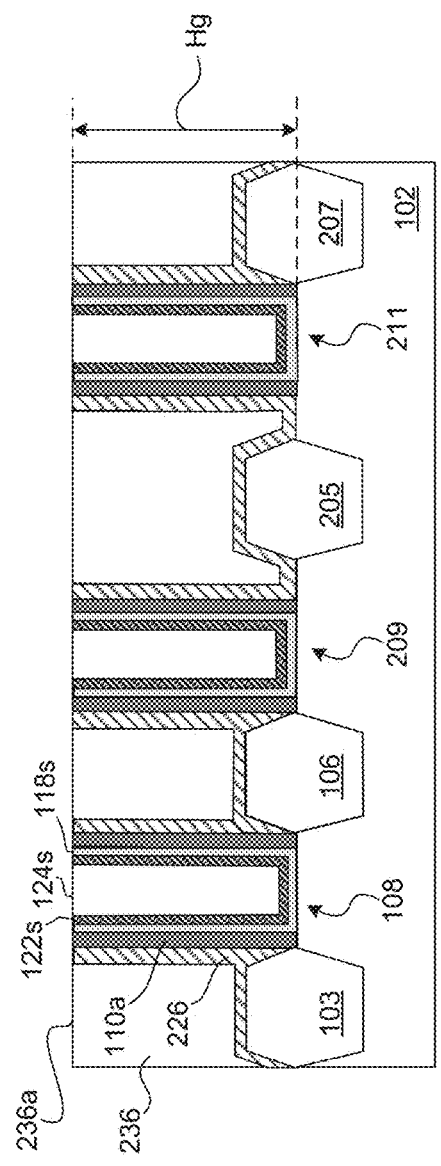
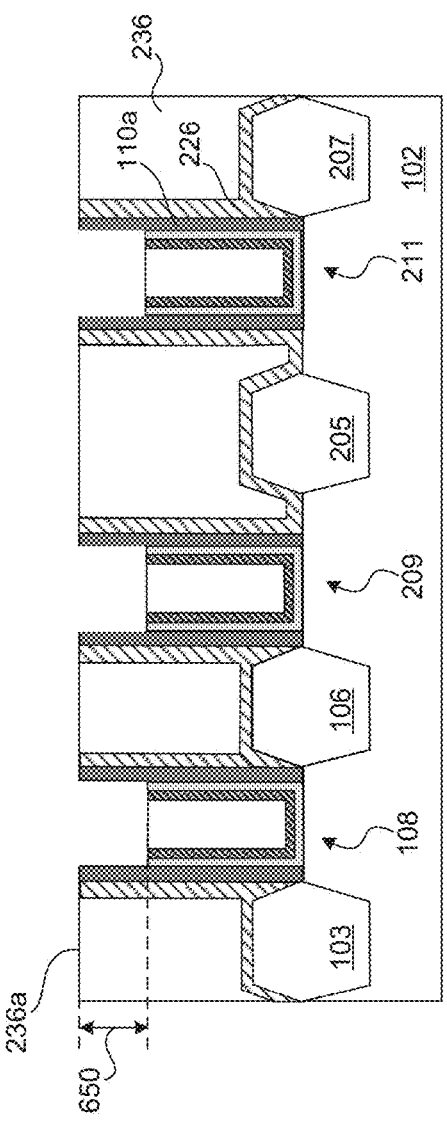

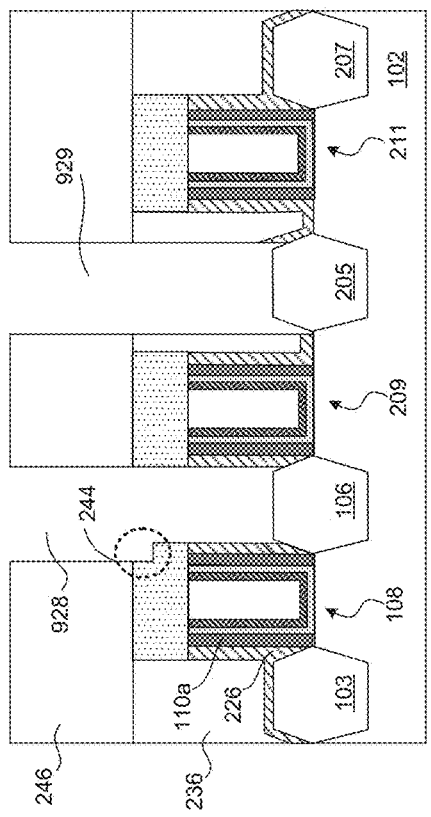
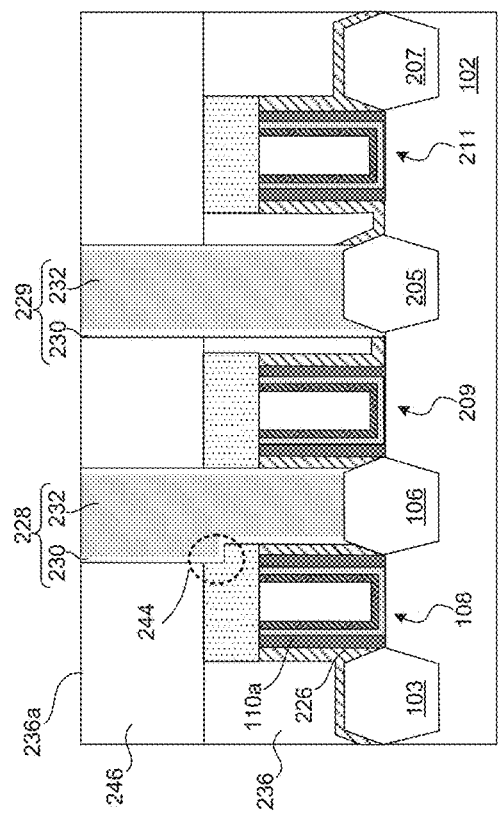

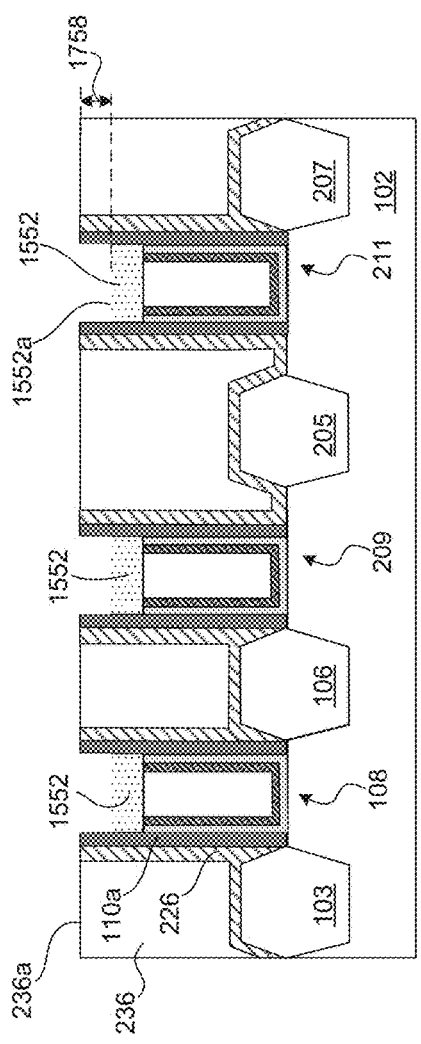
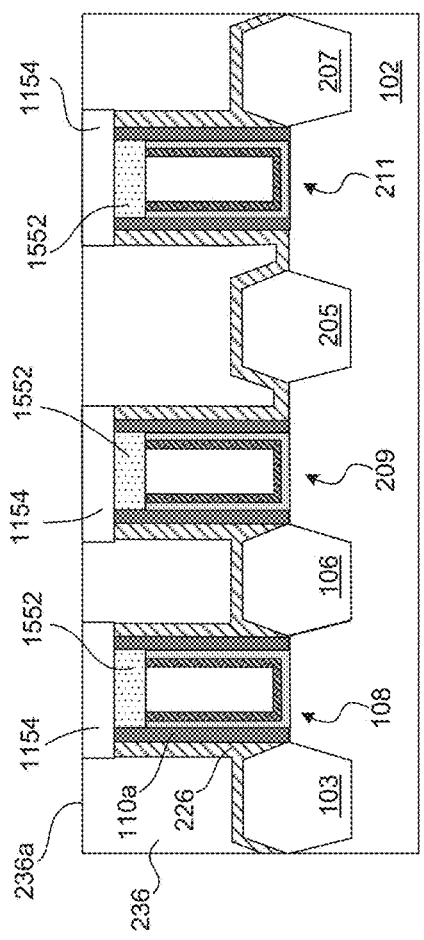
FIG. 17
FIG. 18

GATE STRUCTURE FOR SEMICONDUCTOR DEVICE

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIG. 2 is a cross-sectional view of a fin field effect transistor (finFET), in accordance with some embodiments.

FIG. 3 is a cross-sectional view of a fin field effect transistor (finFET).

FIGS. 5-10 are cross-sectional views of a fin field effect transistor (finFET) at various stages of its fabrication process, in accordance with some embodiments.

FIGS. 17-18 are cross-sectional views of a fin field effect transistor (finFET) at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
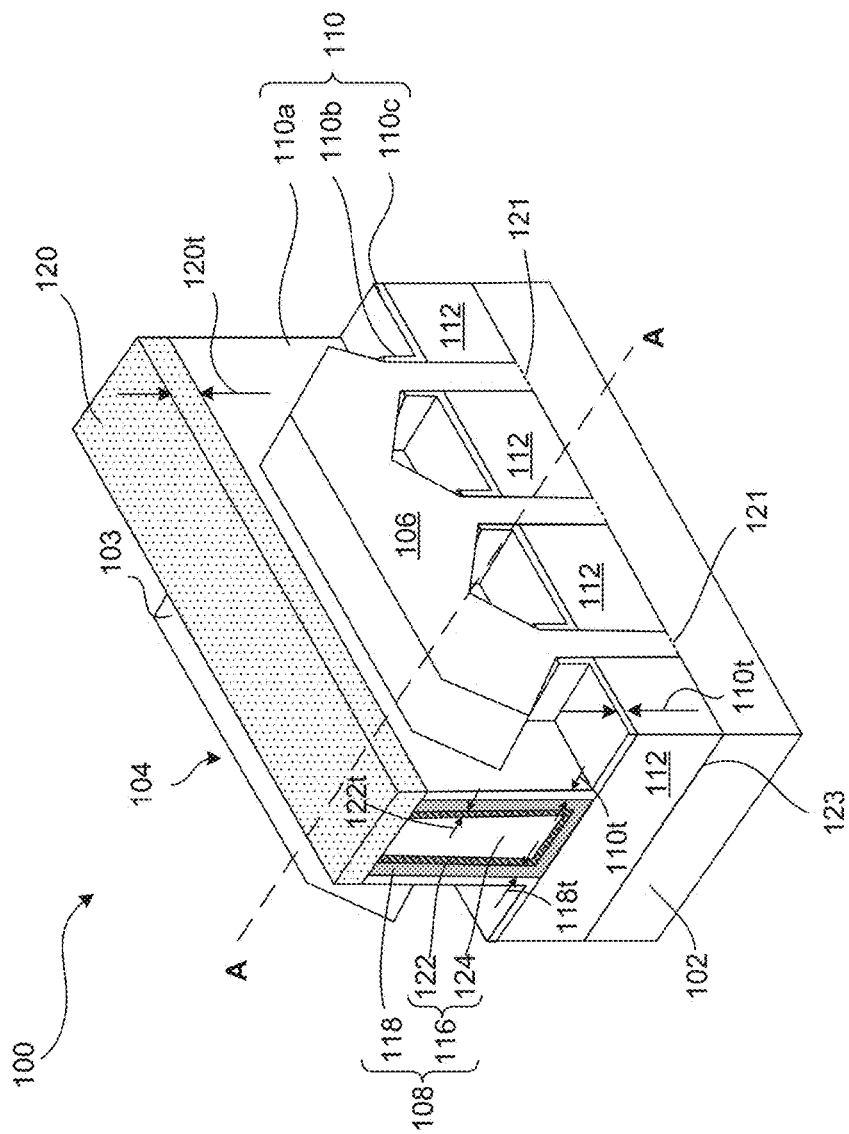
FIG. 1 is an isometric view of a fin field effect transistor (finFET), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "selectivity" refers to the ratio of the etch rates of two materials under the same etching conditions.

The term "about" as used herein indicates the value of a given quantity varies by ±10% of the value, unless noted otherwise.

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials such as, for example, silicon, germanium, gallium arsenide, indium phosphide, etc. Alternatively, the substrate may be made from an electrically non-conductive material such as, for example, a glass or a sapphire wafer.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a small dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as, for example, boron.

As used herein, the term "n-type" defines a structure, layer, and/or region as being doped with n-type dopants, such as, for example, phosphorus.

As used herein, the term "vertical" means nominally perpendicular to the surface of a substrate.

As used herein, the term "critical dimension" refers to the smallest feature size (e.g., line width) of a finFET and/or an element of an integrated circuit.

This disclosure provides example structures and methods for protecting the structural integrity of insulating layers (e.g., spacers, hard masks, and etch stop layers) on gate structures and consequently, preventing electrical shorting between gate structures and source/drain (S/D) contact structures of a FET (e.g., MOSFET or finFET). The example structures and methods describe gate capping structures providing larger gate protection area, during the formation of self-aligned S/D contact structures, compared to gate capping structures of other FETs. Such gate capping structures can prevent the insulating layers from being etched and/or structurally damaged during the S/D contact structure formation, and consequently, prevent the gate structures from making contact with the S/D contact structures.

FIG. 1 is an isometric view of a fin field effect transistor (finFET) 100 after a gate replacement process, according to some embodiments. FinFET 100 may be included in a microprocessor, memory cell, or other integrated circuit. A person of ordinary skill in the art will recognize that the view of finFET 100 in FIG. 1 is shown for illustration purposes and may not be drawn to scale.

FinFET 100 may be formed on a substrate 102 and may include a fin structure 104 having fin regions (not shown) and source/drain (S/D) regions 103 and 106, a gate structure 108 disposed on the fin regions, spacers 110 disposed on opposite sides of gate structure 108, shallow trench isolation (STI) regions 112, and a gate capping structure 120. FIG. 1 shows one gate structure 108. However, based on the disclosure herein, a person of ordinary skill in the art will recognize that finFET 100 may have additional gate structures similar and parallel to gate structure 108. In addition, finFET 100 may be incorporated into an integrated circuit through the use of other structural components such as source/drain (S/D) contact structures, gate contact structures, conductive vias, conductive lines, dielectric layers, passivation layers, etc., that are omitted for the sake of clarity.

Substrate 102 may be physical material on which finFET 100 is formed. Substrate 102 may be a semiconductor material such as, but not limited to, silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 may be doped depending on design requirements (e.g., p-type substrate or n-type substrate). In some embodiments, substrate 102 may be doped with p-type dopants (e.g., boron, indium, aluminum, or gallium) or n-type dopants (e.g., phosphorus or arsenic).

Fin structure 104 represent current carrying structures of finFET 100 and may traverse along a Y-axis and through gate structure 108. Fin structure 104 may include fin regions underlying gate structure 108 and S/D regions 103 and 106 disposed on opposing sides of gate structure 108. Fin regions of fin structure 104 may extend above STI regions 112 and may be wrapped around by gate structure 108. Fin regions may be formed from patterned portions of substrate 102. S/D regions 103 and 106 may form interfaces 121 with substrate 102 and interfaces (not shown) with fin regions under gate structure 108. In some embodiments, interfaces 121 are coplanar with interfaces 123 formed between STI regions 112 and substrate 102. In some embodiments, interfaces 121 are either above or below the level of interfaces 123.

Fin regions of fin structure 104 may include material similar to substrate 102. S/D regions 103 and 106 may include epitaxially-grown semiconductor material. In some embodiments, the epitaxially-grown semiconductor material is the same material as the material of substrate 102. In some embodiments, the epitaxially-grown semiconductor material includes a different material from the material of substrate 102. The epitaxially-grown semiconductor material may include: (i) a semiconductor material such as, for example, germanium or silicon; (ii) a compound semiconductor material such as, for example, gallium arsenide and/or aluminum gallium arsenide; or (iii) a semiconductor alloy such as, for example, silicon germanium and/or gallium arsenide phosphide. Based on the disclosure herein, a person of ordinary skill in the art will recognize that other materials for fin structure 104 are within the scope and spirit of this disclosure.

In some embodiments, S/D regions 103 and 106 may be grown by (i) chemical vapor deposition (CVD) such as, for example, by low pressure CVD (LPCVD), atomic layer CVD (ALCVD), ultrahigh vacuum CVD (UHVCVD), reduced pressure CVD (RPCVD), or a suitable CVD; (ii) molecular beam epitaxy (MBE) processes; (iii) a suitable epitaxial process; or (iv) a combination thereof. In some embodiments, S/D regions 103 and 106 may be grown by an epitaxial deposition/partial etch process, which repeats the epitaxial deposition/partial etch process at least once. Such repeated deposition/partial etch process is also called a "cyclic deposition-etch (CDE) process." In some embodiments, S/D regions 103 and 106 may be grown by selective epitaxial growth (SEG), where an etching gas is added to promote the selective growth of semiconductor material on the exposed surfaces of fin structures, but not on insulating material (e.g., dielectric material of STI regions 112). Based on the disclosure herein, a person of ordinary skill in the art will recognize that other methods for epitaxially growing S/D regions 103 and 106 are within the scope and spirit of this disclosure.

S/D regions 103 and 106 may be p-type regions or n-type regions. In some embodiments, p-type S/D regions 103 and 106 may include SiGe and may be in-situ doped during an epitaxial growth process using p-type dopants such as, for example, boron, indium, or gallium. For p-type in-situ doping, p-type doping precursors such as, but not limited to, diborane ($B_2H_6$), boron trifluoride ($BF_3$), and/or other p-type doping precursors can be used. In some embodiments, n-type S/D regions 103 and 106 may include Si and may be in-situ doped during an epitaxial growth process using n-type dopants such as, for example, phosphorus or arsenic. For n-type in-situ doping, n-type doping precursors such as, but not limited to, phosphine ($PH_3$), arsine ($AsH_3$), and/or other n-type doping precursor can be used. In some embodiments, S/D regions 103 and 106 are not in-situ doped, and an ion implantation process is performed to dope S/D regions 103 and 106.

Gate structure 108 may include a gate electrode 116 and a dielectric layer 118 adjacent to and in contact with gate electrode 116. Gate structure 108 may be formed by a gate replacement process.

In some embodiments, dielectric layer 118 may have a thickness 118t in a range of about 1 nm to about 5 nm. Dielectric layer 118 may include silicon oxide and may be formed by CVD, atomic layer deposition (ALD), physical vapor deposition (PVD), e-beam evaporation, or other suitable process. In some embodiments, dielectric layer 118 may include (i) a layer of silicon oxide, silicon nitride, and/or silicon oxynitride, (ii) a high-k dielectric material such as, for example, hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers may be formed by ALD and/or other suitable methods. In some embodiments, dielectric layer 118 may include a single layer or a stack of insulating material layers. Based on the disclosure herein, a person of ordinary skill in the art will recognize that other materials and formation methods for dielectric layer 118 are within the scope and spirit of this disclosure.

Gate electrode 116 may include a gate work function metal layer 122 and a gate metal fill layer 124. In some embodiments, gate work function metal layer 122 is disposed on dielectric layer 118. Gate work function metal layer 122 may include a single metal layer or a stack of metal layers. The stack of metal layers may include metals having work functions similar to or different from each other. In some embodiments, gate work function metal layer 122 may include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. Gate work function metal layer 122 may be formed using a suitable process such as ALD, CVD, PVD, plating, or combinations thereof. In some embodiments, gate work function metal layer 122 has a thickness 122t in a range from about 2 nm to about 15 nm. Based on the disclosure herein, a person of ordinary skill in the art will recognize that other materials, formation methods, and thicknesses for gate work function metal layer 122 are within the scope and spirit of this disclosure.

Gate metal fill layer 124 may include a single metal layer or a stack of metal layers. The stack of metal layers may include metals different from each other. In some embodiments, gate metal fill layer 124 may include a suitable conductive material such as, for example, Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. Gate metal fill layer 124 may be formed by ALD, PVD, CVD, or other suitable deposition process. Based on the disclosure herein, a person of ordinary skill in the art will recognize that other materials and formation methods for gate metal fill layer 124 are within the scope and spirit of this disclosure.

Spacer 110 may include spacer portions 110a that form sidewalls of gate structure 108 and are in contact with dielectric layer 118, spacer portions 110b that form sidewalls of fin structure 104, and spacer portions 110c that form protective layers on STI regions 112. Spacers 110 may include insulating material such as, for example, silicon oxide, silicon nitride, a low-k material, or a combination thereof. Spacers 110 may have a low-k material with a dielectric constant less than 3.9 (e.g., less than 3.5, 3, or 2.8). In some embodiments, each of spacers 110 may have a thickness 110t in a range from about 7 nm to about 10 nm. Based on the disclosure herein, a person of ordinary skill in the art will recognize that other materials and thicknesses for spacers 110 are within the scope and spirit of this disclosure.

Gate capping structure 120 may be disposed on gate structure 108, spacers 110, and/or etch stop layer (ESL) (not shown in FIG. 1; shown in FIG. 2) and may be configured to protect these underlying structures and/or layers during subsequent processing of finFET 100. For example, gate capping structure 120 may be configured to act as an etch stop layer during formation of S/D contact structures (not shown in FIG. 1; shown in FIG. 2). In some embodiments, a gate capping structure thickness 120t may range from about 10 nm to about 70 nm. Gate capping structure 120 may include one or more layers of insulating material having (i) nitride-based material such as, for example, silicon nitride, silicon-rich nitride, silicon oxynitride, titanium nitride; (ii) carbide-based material such as, for example, silicon carbide, titanium carbide, tungsten carbide, other suitable metal carbides; (iii) an elementary semiconductor such as, for example, silicon; (iv) metal oxide-based material; or (v) a combination thereof. In some embodiments, gate capping structure 120 may include a stack of layers of insulating material, where each layer of the stack may have a material and dimensions different from each other layers in the stack. The stack of layers may include two or more layers of the insulating material. Based on the disclosure herein, a person of ordinary skill in the art will recognize that other materials and thicknesses for gate capping structure 120 are within the scope and spirit of this disclosure.

STI regions 112 may provide electrical isolation to finFET 100 from neighboring active and passive elements (not illustrated herein) integrated with or deposited onto substrate 102. STI regions 112 may have a dielectric material such as, for example, silicon oxide, silicon nitride, silicon oxynitride, fluorine-doped silicate glass (FSG), a low-k dielectric material, and/or other suitable insulating material. In some embodiments, STI regions 112 may include a multi-layered structure.

FIG. 2 is a cross-sectional view along line A-A of finFET 100 of FIG. 1, according to some embodiments. FIG. 2 describes additional structures of finFET 100 (e.g., source/drain (S/D) regions 205 and 207, gate structures 209 and 211, etch stop layer (ESL) 226, first and second interlayer dielectric (ILD) layers 236 and 246, S/D contact structures 228 and 229), according to some embodiments. Elements in FIG. 2 with the same annotations as elements in FIG. 1 are described above. The above discussion of S/D regions 103 and 106 applies to S/D regions 205 and 207, the discussion of gate structure 108 applies to gate structures 209 and 211, and the discussion of gate capping structure 120 applies to gate capping structure 120* unless mentioned otherwise. A person of ordinary skill in the art will recognize that the view of finFET 100 in FIG. 2 is shown for illustration purposes and may not be drawn to scale. Based on the disclosure herein, a person of ordinary skill in the art will recognize that cross-sectional shapes of S/D regions 103, 106, 205, and 207, gate structures 108, 209, and 211, spacers 110, and STI regions 112 are illustrative and are not intended to be limiting.

ESL 226 may be configured to protect S/D regions 103 and 207 and/or gate structures 108, 209, and 211, for example, during formation of S/D contact structures 228 and 229 on S/D regions 106 and 205. ESL 226 may be disposed on sides of spacers 110a and on dummy S/D regions (e.g., S/D regions 103 and 207) that may be electrically insulated from other elements of finFET 100 and/or of the integrated circuit. In some embodiments, ESL 226 may include, for example, silicon nitride ($SiN_x$), silicon oxide ($SiO_x$), silicon oxynitride (SiON), silicon carbide (SiC), silicon carbonitride (SiCN), boron nitride (BN), silicon boron nitride (SiBN), silicon carbon boron nitride (SiCBN), or a combination thereof. In some embodiments, ESL 226 may include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, ESL 226 has a thickness 226t in a range from about 3 nm to 10 nm or from about 10 nm to about 30 nm. Based on the disclosure herein, a person of ordinary skill in the art will recognize that other materials, formation methods, and thicknesses for etch stop layer 226 are within the scope and spirit of this disclosure.

First ILD layer 236 may be disposed on ESL 226 and gate capping structures 120* and 120. Second ILD layer 246 may be disposed on first ILD layer 236. Each of first and second ILD layers 236 and 246 may include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide may be deposited for first and second ILD layers 236 and 246 using flowable CVD (FCVD). In some embodiments, the dielectric material is silicon oxide. In some embodiments, first and second ILD layers 236 and 246 may have oxide materials different from each other. In some embodiments, first ILD layer 236 may have a thickness in a range from about 50 nm to about 200 nm. In some embodiments, second ILD layer 246 each may have a thickness in a range from about 50 nm to about 600 nm. Based on the disclosure herein, a person of ordinary skill in the art will recognize that other materials, thicknesses, and formation methods for first and second ILD layers 236 and 246 are within the scope and spirit of this disclosure.

S/D contact structures 228 and 229 may be configured to electrically connect respective S/D regions 106 and 205 to other elements of finFET 100 and/or of the integrated circuit. S/D contact structures 228 and 229 may be formed on top surfaces of respective S/D regions 106 and 205 and within first and second ILD layers 236 and 246. In some embodiments, of S/D conductive structures 228 and 229 may be formed after the formation of second ILD layer 246. In some embodiments, portions of conductive structures 228 and 229 within first ILD layer 236 may be formed prior to the formation of second ILD layer 246 and portions of conductive structures 228 and 229 within second ILD layer 246 may be formed after the formation of second ILD layer 246.

Each of S/D contact structures 228 and 229 may include a conductive region 232 and a conductive liner 230 underlying conductive region 232. In some embodiments, conductive liners 230 may be configured as diffusion barriers to prevent diffusion of unwanted atoms and/or ions into S/D regions 106 and 205 during formation of conductive regions 232. In some embodiments, each of conductive liners 230 may include a single layer or a stack of conductive materials such as, for example, TiN, Ti, Ni, TaN, Ta, or a combination thereof. In some embodiments, each of conductive liners 230 may act as an adhesion-promoting-layer, a glue-layer, a primer-layer, a protective-layer, and/or a nucleation-layer. Conductive liners 230 may have a thickness 230t in a range from about 1 nm to about 2 nm, according to some embodiments.

In some embodiments, conductive regions 232 may include conductive materials such as, for example, W, Al, or Co. In some embodiments, conductive regions 232 may each have an average horizontal dimension (e.g., width) in a range from about 15 nm to about 25 nm and may each have an average vertical dimension (e.g., height) in a range from about 400 nm to about 600 nm. Based on the disclosure herein, a person of ordinary skill in the art will recognize that other materials and dimensions for conductive liners 230 and conducive regions 232 are within the scope and spirit of this disclosure.

A self-alignment process may be used to form S/D contact structures 228 and 229 after the formation of second ILD layer 246. For example, S/D contact structure 228 may be self-aligned with respect to the region having a width 234 between gate structures 108 and 209 and over S/D region 106. To form S/D contact structure 228, an etch window having a width 238 may be patterned, for example by photolithography on second ILD layer 246. The patterning may be followed by an etching of the exposed second ILD layer 246 through the etch window to form a contact opening having width 238. Formation of contact opening in second ILD layer 246 may be followed by etching of portion of first ILD layer 236 between gate structures 108 and 209 and over S/D region 106. The etched areas in first and second ILD layers 236 and 246 may then be filled with conductive material.

The self-alignment process allows contact opening width 238 in second ILD layer 246 to be larger than contact opening width 234 in first ILD layer 236 and provides a relief to the photolithography alignment requirements to effectively increase the alignment tolerance window for S/D contact structure 228 formation. However, as technology nodes continue to decrease and gate-to-gate pitch (e.g., pitch 240 between gate structures 108 and 209) continues to become smaller. Smaller gate-to-gate pitch results in narrower regions (e.g., width 234) of ILD layer (e.g., first ILD layer 236) over S/D regions (e.g., S/D region 106) between the gates (e.g., gate structures 108 and 209) that may be etched to form self-aligned S/D contact structures (e.g., S/D contact structure 228). Etching such narrow regions of ILD layer are challenging, which the embodiments described in this disclosure help to overcome. In some embodiments, pitch 240 between gate structures 108 and 209 may be less than 25 nm, for example, in a range from about 5 nm to about 20 nm. In some embodiments, pitch 242 between gate structures 209 and 211 may be greater than 25 nm.

An example of the challenges of forming self-aligned S/D contact structures (e.g., S/D contact structure 228) in such narrow regions (e.g., width 234) of ILD layer (e.g., first ILD layer 236) between gate structures (e.g., gate structures 108 and 209) is illustrated in FIG. 3. FIG. 3 shows a cross-sectional view of a finFET 100*, which may be similar to finFET 100 unless mentioned otherwise. For the formation of S/D contact structure 228, the region of first ILD layer 236 between gate structures 108 and 209 is etched after etching of second ILD layer 246 through patterned etch window having width 238. Due to narrow width 234 (e.g., less than pitch 240), and as a result, higher aspect ratio of the region of first ILD layer 236 between gate structures 108 and 209, etch time for this region may be longer than wider regions of first ILD layers gate between gate structures having pitch larger than pitch 240 (e.g., pitch 242 of FIG. 2). Longer etch time may result in gate capping structures 120**, spacer 110a, and/or etch stop layer (ESL) 226 on gate structure 108 being etched, when etched area in second ILD layer 246 overlaps gate structure 108. This etch may expose portions of gate structure 108, which may then be electrically shorted with the conductive material filled in the etched regions of first and second ILD layers 236 and 246 to form S/D contact structures 228. The dotted circle 244* in FIG. 3 indicates the electrical short between the exposed portion of gate structure 108 and S/D contact structure 228. In some embodiments, such electrical short may occur with gate structure 209 when the etched area (i.e., contact opening) in second ILD layer 246 alternately or additionally overlaps (not shown) gate structure 209.

Referring back to FIG. 2, gate capping structures 120* and 120 may be configured to act as etch stop layers and to prevent exposure of gate structures during S/D contact structure formation, and consequently, prevent electrical shorting, for example, as shown in FIG. 3 between the exposed gate structures and self-aligned S/D contact structures. The use of gate capping structures 120* and 120 helps to overcome the challenges of etching narrow first ILD layer regions (e.g., as shown in FIG. 3) without modifying the chemistry of etchants and/or adjusting the etch process parameters used in fabrication of other finFETs (e.g., finFET 100*), semiconductor devices, and/or integrated circuits. Adjusting the chemistry of etchants and/or the etch process parameters may lead to adjustments in other fabrication steps to ensure compatibility of the adjustments to the other fabrication steps, which may be time consuming and not cost effective, and thus, create additional fabrication challenges.

As shown in FIG. 2, gate capping structures 120* and 120 are disposed in a manner such that these structures cover top surfaces of gate structures 108, 209, and 211, spacers 110a, and ESL 226. As such, unlike gate capping structure 120**, gate capping structures 120* and 120 protect spacers 110 and ESL 226 from being etched during the etching of first ILD layer 236 in the narrow region of width 234, which may be smaller than gate-to-gate pitch 240. Covering spacers 110a and ESL 226 with gate capping structures 120* and 120 may also prevent interfaces 320 and 325 from being exposed to the etching process, as interfaces are more vulnerable to etching process than a continuous structure. In some embodiments, gate capping structures 120* and 120 may each have a horizontal dimension (e.g., width) Wc greater than a horizontal dimension (e.g., gate length) Lg of each of gate structures 108, 209, and 211. In some embodiments, Wc may be equal to or greater than 1.1 times of Lg. In some embodiments, Lg may range from about 5 nm to about 30 nm.

In addition, gate capping structures 120* and 120 have a thickness 120t that may be thicker than thickness (e.g., thickness 120t) of gate capping structures (e.g., gate capping structure 120) of other finFETs (e.g., finFET 100**). Thicker gate capping structures 120* and 120 may provide additional vertical dimension, so that even if some portions of gate capping structures 120* and 120 are etched, the etched region does not reach gate structures, spacers, and/or etch stop layers. For example, dotted circle 244 in FIG. 2 shows an etched region, filled with conductive material of conductive liner 230 and conductive region 232, in gate capping structure 120* that does not reach gate structure 108, spacer 110a, and/or ESL 226. Additionally or alternatively, gate capping structures 120* and 120 may include a material having a higher etch selectivity than the material included in gate capping structures (e.g., gate capping structure 120) of other finFETs (e.g., finFET 100). In some embodiments, etchant's selectivity for the material of first and second ILD layers 236 and 246 may be, for example, 20 times, 50 times, or 100 times greater than for the material included in gate capping structures 120* and 120.

In some embodiments, gate capping structure 120 on gate structure 209 may act as an etch stop layer when contact opening width 238 alternately or additionally overlaps (not shown) overlaps gate capping structure 120. In some embodiments, S/D contact structure 229 may not overlap gate capping structures 120 on gate structures 209 and 211 when pitch 242, for example, is greater than 25 nm.

Based on the disclosure herein, a person of ordinary skill in the art will recognize that S/D contact structures 228 and/or 229 may be formed on other S/D regions (e.g., on S/D regions 103 and 207) of finFET 100. In some embodiments, S/D regions 103 and 207 are not connected to conductive structures and may be electrically insulated from other elements of finFET 100 and/or of the integrated circuit. In some embodiments, a metal silicide may be formed at interfaces between conductive structures 228 and 229 and respective S/D regions 106 and 205.

Figure 4:
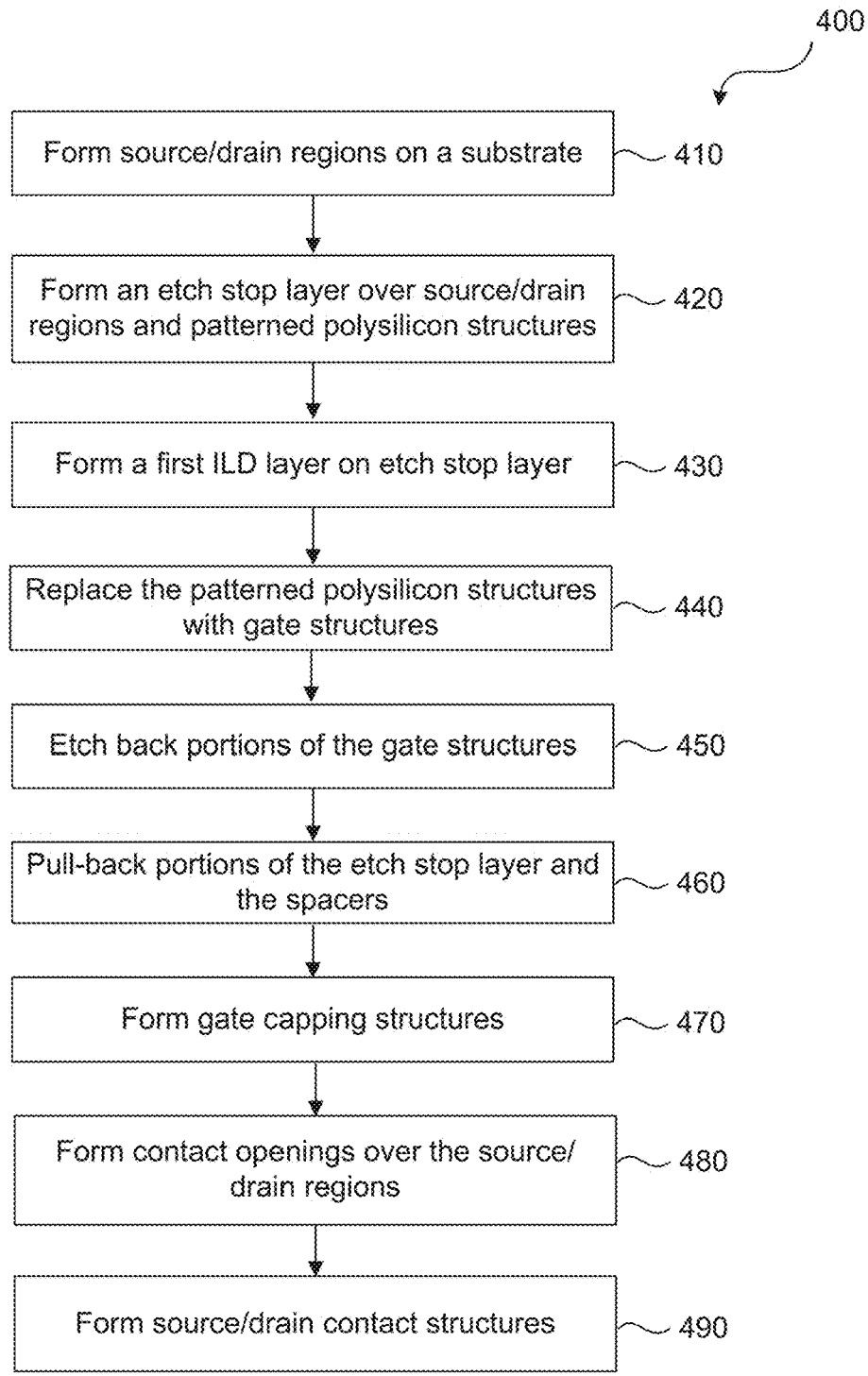
FIG. 4 is flow diagram of a method for fabricating a fin field effect transistor (finFET), in accordance with some embodiments.

FIG. 4 is a flow diagram of an example method 400 for fabricating finFET 100, according to some embodiments. For illustrative purposes, the operations illustrated in FIG. 4 will be described with reference to the example fabrication process illustrated in FIGS. 5-10. FIGS. 5-10 are cross-sectional views of finFET 100 at various stages of its fabrication, according to some embodiments. Operations can be performed in a different order or not performed depending on specific applications. It should be noted that method 400 does not produce a complete finFET 100. Accordingly, it is understood that additional processes may be provided before, during, and after method 400, and that some other processes may only be briefly described herein.

In operation 410, source/drain (S/D) regions are formed on a substrate. For example, as shown in FIG. 5, S/D regions 103, 106, 205, and 207 may be formed on a substrate 102. Semiconductor material of S/D regions 103, 106, 205, and 207 may be selectively epitaxially-grown. In some embodiments, the selective epitaxial growth of the semiconductor material of S/D regions 103, 106, 205, and 207 may continue until the semiconductor material extends vertically a distance in a range from about 10 nm to about 100 nm above top surface of substrate 102. The epitaxial processes for growing the semiconductor material may include CVD deposition techniques (e.g., LPCVD, vapor-phase epitaxy (VPE), and/or ultra-high vacuum CVD (UHV-CVD)), molecular beam epitaxy, and/or other suitable processes. The semiconductor material may include: (i) a semiconductor material such as, for example, germanium or silicon; (ii) a compound semiconductor material such as, for example, gallium arsenide and/or aluminum gallium arsenide; or (iii) a semiconductor alloy such as, for example, silicon germanium and/or gallium arsenide phosphide. In some embodiments, p-type S/D regions 103, 106, 205, and 207 may include SiGe and may be in-situ doped during an epitaxial growth process using p-type dopants such as, for example, boron, indium, or gallium. In some embodiments, n-type S/D regions 103, 106, 205, and 207 may include Si and may be in-situ doped during an epitaxial growth process using n-type dopants such as, for example, phosphorus or arsenic.

In operation 420, an etch stop layer (ESL) is deposited over S/D regions and patterned polysilicon structures. For example, as shown in FIG. 5, ESL 226 etch stop layer may be formed over S/D regions 103, 106, 205, and 207 and patterned polysilicon structures that may be subsequently replaced by gate structures 108, 209, and 211. In some embodiments, ESL 226 may include, for example, SiNx, SiON, SiC, SiCN, BN, SiBN, SiCBN, or a combination thereof. In some embodiments, ESL 226 may include silicon nitride formed by low pressure chemical vapor deposition (LPCVD), plasma enhanced chemical vapor deposition (PECVD), chemical vapor deposition (CVD), or atomic layer deposition (ALD).

In operation 430, an ILD layer is formed on the ESL. For example, as shown in FIG. 5, first ILD layer 236 may be formed on ESL 226. First ILD layer 236 may include a dielectric material. The dielectric material of first ILD layer 236 may be deposited using a deposition method suitable for flowable dielectric materials (e.g., flowable silicon oxide). For example, flowable silicon oxide may be deposited for first ILD layer 236 using flowable CVD (FCVD).

In operation 440, the patterned polysilicon structures are replaced with gate structures. For example, as shown in FIG. 5, gate structures 108, 209, and 211 may be formed after removing the patterned polysilicon structures using a dry etching process (e.g., reaction ion etching) or a wet etching process. In some embodiments, the gas etchants used in etching of the patterned polysilicon structures may include chlorine, fluorine, or bromine. In some embodiments, an $NH_4OH$ wet etch may be used to remove the patterned polysilicon structures, or a dry etch followed by a wet etch process may be used to remove the patterned polysilicon structures.

The formation of gate structures 108, 209, and 211 may include deposition of dielectric layer 118 on S/D regions 103, 106, 205, and 207 and on sidewalls of spacers 110a, as shown in FIG. 5. Dielectric layer 118 may include silicon oxide and may be formed by CVD, atomic layer deposition (ALD), physical vapor deposition (PVD), e-beam evaporation, or other suitable process. In some embodiments, dielectric layer 118 may include (i) a layer of silicon oxide, silicon nitride, and/or silicon oxynitride, (ii) a high-k dielectric material such as, for example, hafnium oxide ($HfO_2$), $TiO_2$, HfZrO, $Ta_2O_4$, $HfSiO_4$, $ZrO_2$, $ZrSiO_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) a combination thereof. High-k dielectric layers may be formed by ALD and/or other suitable methods. In some embodiments, dielectric layer 118 may include a single layer or a stack of insulating material layers.

The deposition of dielectric layer 118 may be followed by deposition of gate work function metal layer 122. Gate work function metal layer 122 may include a single metal layer or a stack of metal layers. The stack of metal layers may include metals having work functions similar to or different from each other. In some embodiments, gate work function metal layer 122 may include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. Gate work function metal layer 122 may be formed using a suitable process such as ALD, CVD, PVD, plating, or combinations thereof.

The deposition of gate work function metal layer 122 may be followed by deposition of gate metal fill layer 124. Gate metal fill layer 124 may include a single metal layer or a stack of metal layers. The stack of metal layers may include metals different from each other. In some embodiments, gate metal fill layer 124 may include a suitable conductive material such as, for example, Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate metal fill layer 124 may be formed by ALD, PVD, CVD, or other suitable deposition process.

The deposited dielectric layer 118, gate work function metal layer 122, and gate metal fill layer 124 may be planarized using by a chemical mechanical polishing (CMP) process. The CMP process may coplanarize top surfaces 118s, 122s, and 124s of dielectric layer 118, gate work function metal layer 122, and gate metal fill layer 124, respectively, with top surface 236a of first ILD layer 236 as shown in FIG. 5. In some embodiments, each of gate structures 108, 209, and 211 may have a height Hg ranging from about 40 nm to about 200 nm.

In operation 450, portions of the gate structures are removed. For example, as shown in FIG. 6, each of gate structures 108, 209, and 211 may be etched back by a vertical dimension 650 from top surface 236a. In some embodiments, vertical dimension 650 may range from about 15 nm to about 80 nm for gate structures 108, 209, and 211 having an Hg (as shown in FIG. 5) ranging from about 40 nm to about 200 nm prior to the etch back of gate structures 108, 209, and 211. The etch back process may be performed by a dry etch process. The dry etch process may use a fluorine-based etchant. In some embodiments, the dry etch may be performed using a gas mixture including carbon tetrafluoride ($CF_4$), fluoromethane ($CH_3F$), and fluoroform ($CHF_3$). Oxygen and hydrogen gases may be included in the gas mixture for selectivity. The flow rate of the gas mixture may range from about 50 sccm to about 950 sccm. The ratio of $CH_3F$ to oxygen during the etch process may range from about 1:10 to about 10:1. The etch process may be carried out at a temperature ranging from about 10° C. to about 100° C., under a pressure ranging from about 10 mTorr to about 100 mTorr.

Figure 7:
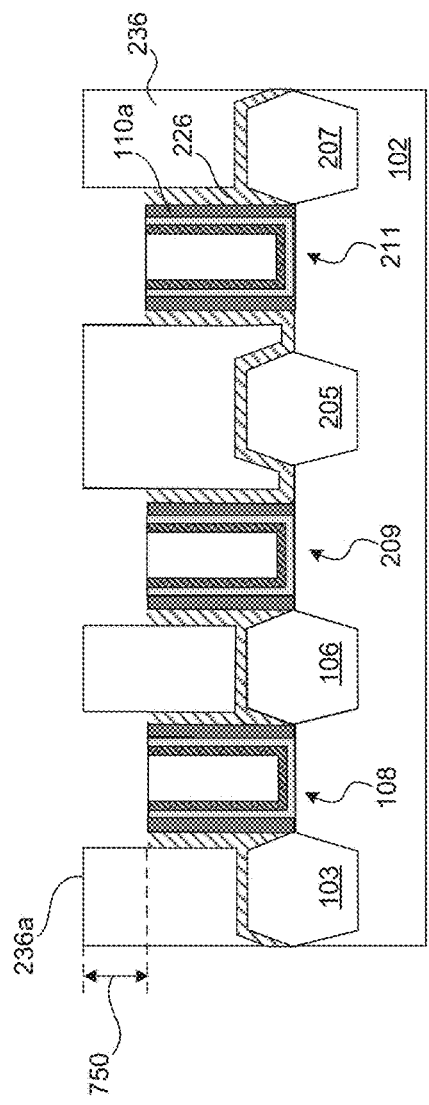

In operation 460, portions of the ESL and spacers are removed. For example, as shown in FIG. 7, ESL 226 and spacers 110a may be pulled back by a vertical dimension 750 from top surface 236a. In some embodiments, vertical dimension 750 may be equal to vertical dimension 650 shown in FIG. 6. In some embodiments, both ESL 226 and spacers 110a may be etched back substantially simultaneously. The pull-back process may include performing etch and deposition in a cyclic manner. In some embodiments, the etch and deposition cycle may be repeated N number of times, where N may be an integer in a range of 1 to 10.

The etch process may be a dry etch process performed using an etching gas mixture having nitrogen trifluoride ($NF_3$), hydrogen bromide (HBr), methane ($CH_4$), and argon (Ar). The etching gas mixture may have a spacer 110a to first ILD layer 236 selectivity greater than about 20:1, such as about 21:1, about 25:1, or about 30:1. In some embodiments, the etch process may have an etch rate ranging from about 2 nm to about 4 nm per etch/deposition cycle.

The deposition process may include deposition of oxide layer on first ILD layer 236 using a gas mixture having silicon tetrachloride ($SiCl_4$) and oxygen. The deposited oxide may help to restore some portions of first ILD layer 236 etched from top surface 236a during the etch process. In some embodiments, a thickness of first ILD layer 236 ranging from about 0.05 nm to about 0.2 nm may be removed from top surface 236a per etch/deposition cycle.

The pull-back process may be followed by a cleaning process to remove unwanted material (e.g., carbon-based residue from pull-back process) from the structure of FIG. 7. The cleaning process may include treating the structure of FIG. 7 in diluted HF.

Figure 8:
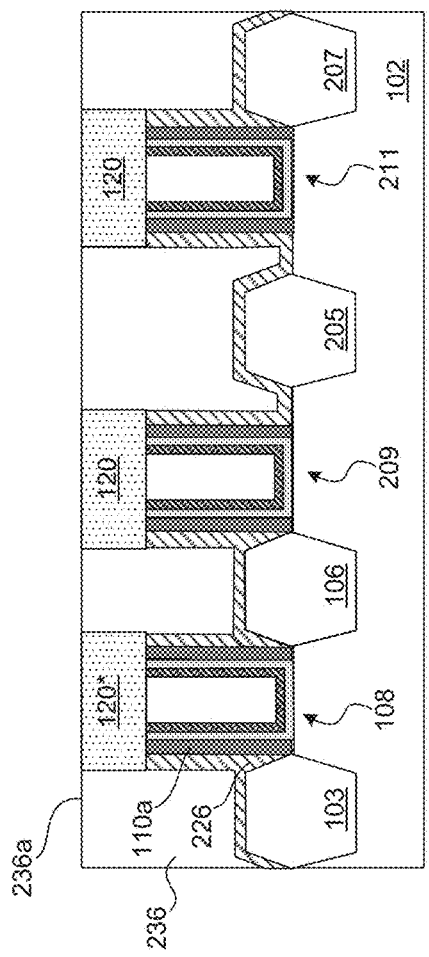

In operation 470, gate capping structures are formed on the etched back gate structures and pulled-back ESL and spacers. For example, as shown in FIG. 8, gate capping structures 120* and 120 may be formed on ESL 226, spacers 110a, and gate structures 108, 209, and 211. Gate capping structures 120* and 120 may each include one or more layers of insulating material deposited, for example, using an ALD process. The one or more layers of insulating material may have (i) nitride-based material such as, for example, silicon nitride, silicon-rich nitride, silicon oxynitride, titanium nitride; (ii) carbide-based material such as, for example, silicon carbide, titanium carbide, tungsten carbide, other suitable metal carbides; (iii) an elementary semiconductor such as, for example, silicon; (iv) metal oxide-based material; or (v) a combination thereof. The deposition of insulating material(s) for gate capping structures 120* and 120 may be followed by a CMP process to coplanarize top surfaces of gate capping structures 120* and 120 with top surface 236a.

In operation 480, contact openings are formed on the S/D regions. For example, as shown in FIG. 9, contact openings 928 and 929 may be formed on S/D regions 106 and 205 after the formation of second ILD layer 246. The formation of contact openings 928 and 929 may include (i) removing portions of first and second ILD layers 236 and 246 overlying S/D regions 106 and 205 and (ii) removing portions of ESL 226 underlying the etched portions of first ILD layer 236. The removal of the portions of first and second ILD layers 236 and 246 may include patterning using photolithography to expose areas on top surface of second ILD layer 246 corresponding to the portions of first and second ILD layers 236 and 246 that are to be removed. The portions of first and second ILD layers 236 and 246 may be removed by a dry etching process. In some embodiments, the dry etching process may be a fluorine-based process.

The etch process may include two steps. In the first etch step, etching may be performed using $CF_4$ gas at a flow rate ranging from about 50 sccm to about 500 sccm. In the second etch step, etching may be performed using a gas mixture including $C_4F_6$ gas at a flow rate ranging from about 5 sccm to about 50 sccm, Ar gas at a flow rate ranging from about 100 sccm to about 500 sccm, and $O_2$ gas at a flow rate ranging from about 5 sccm to about 50 sccm. In some embodiments, each of the first and second etch steps may be carried out for a time period ranging from about 1 sec to about 60 sec. In some embodiments, each of the first and second etch steps may be performed at a temperature ranging from about 10° C. to about 100° C., under a pressure ranging from about 3 mTorr to about 500 mTorr, and at an RF power ranging from about 300 W to about 800 W. In some embodiments, the first etch step has a higher etch rate than the second etch step.

The etching of first and second ILD layers 236 and 246 may be followed by a dry etching of portions of ESL 226 underlying the etched portions of first and second ILD layers 236 and 246. In some embodiments, these portions of ESL 226 may be etched in two steps. In the first etch step, etching may be performed using a gas mixture including difluoromethane ($CH_2F2$) gas at a flow rate ranging from about 5 sccm to about 50 sccm and carbon tetrafluoride ($CF_4$) gas at a flow rate ranging from about 10 sccm to about 100 sccm. In the second etch step, etching may be performed using a gas mixture including fluoromethane ($CH_3F$) gas at a flow rate ranging from about 5 sccm to about 50 sccm, Ar gas at a flow rate ranging from about 100 sccm to about 500 sccm, and $H_2$ gas at a flow rate ranging from about 100 sccm to about 500 sccm. In some embodiments, each of the first and second etch steps may be carried out for a time period ranging from about 1 sec to about 60 sec. In some embodiments, each of the first and second etch steps may be performed at a temperature ranging from about 10° C. to about 100° C., under a pressure ranging from about 10 mTorr to about 100 mTorr, and at an RF power ranging from about 500 W to about 800 W. In some embodiments, the first etch step has a higher etch rate than the second etch step.

In operation 490, S/D contact structures are formed on the S/D regions. For example, as shown in FIG. 10, S/D contact structures 228 and 229 may be formed on respective S/D regions 106 and 205. The formation of conductive liners 230 and conductive regions 232 may include deposition of materials of conductive liners 230 and conductive regions 232. Blanket deposition of the materials of conductive liners 230 may be done using, for example, PVD, CVD, or ALD. In some embodiments, conductive liners 230 may include a single layer or a stack of conductive materials such as, for example, TiN, Ti, Ni, TaN, Ta, a suitable conductive material, or a combination thereof. The deposited materials may be thermally treated using, for example, a rapid thermal anneal process at a temperature ranging from about 500° C. to about 600° C. for a time period ranging from about 10 sec to about 20 sec. Deposition of conductive liners 230 may be followed by a deposition of the materials of conductive regions 232 using, for example, PVD, CVD, or ALD, according to some embodiments. In some embodiments, conductive regions 232 may include a conductive material such as, for example, W, Al, Co, Cu, or a suitable conductive material.

The deposition of the materials of conductive liners 230 and conductive regions 232 may be followed by a CMP process to coplanarize top surfaces of conductive liners 230 and conductive regions 232 with top surface 246a. In some embodiments, the CMP process, may use a silicon or an aluminum abrasive with abrasive concentrations ranging from about 0.1% to about 3%. In some embodiments, the silicon or aluminum abrasive may have a pH level less than 7 for W metal in conductive regions 232 or may have a pH level greater than 7 for cobalt (Co) or copper (Cu) metals in conductive regions 232.

Figure 11:
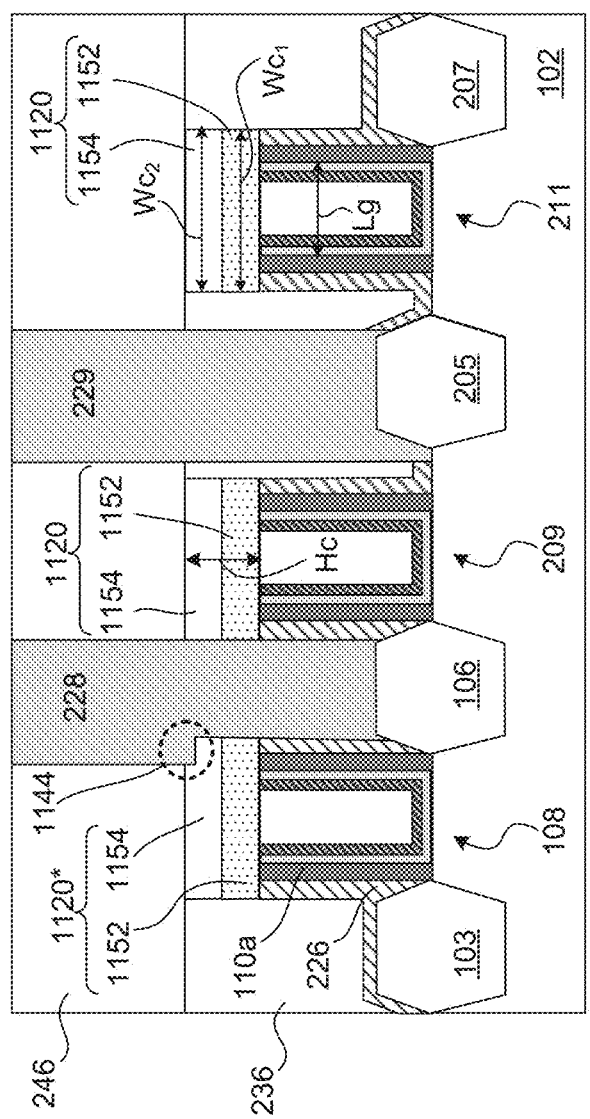
FIG. 11 is a cross-sectional view of a fin field effect transistor (finFET), in accordance with some embodiments.

FIG. 11 is another cross-sectional view along line A-A of finFET 100 of FIG. 1, according to some embodiments. Elements in FIG. 11 with the same annotations as elements in FIGS. 1-2 are described above. The above discussion of gate capping structure 120* and 120 applies to gate capping structure 1120* and 1120 unless mentioned otherwise. A person of ordinary skill in the art will recognize that the view of finFET 100 in FIG. 11 is shown for illustration purposes and may not be drawn to scale.

Similar to gate capping structures 120* and 120, gate capping structures 1120* and 1120 may be configured to protect ESL 226, spacers 110a, and gate structures 108, 209, and 211 during formation of S/D contact structures 228 and 229. Gate capping structures 1120* and 1120 may each include first and second layers 1152 and 1154. First and second layers 1152 and 1154 may each include an insulating material having (i) nitride-based material such as, for example, silicon nitride, silicon-rich nitride, silicon oxynitride, titanium nitride; (ii) carbide-based material such as, for example, silicon carbide, titanium carbide, tungsten carbide, other suitable metal carbides; (iii) an elementary semiconductor such as, for example, silicon; (iv) metal oxide-based material; or (v) a combination thereof. In some embodiments, first layers 1152 may include nitride-based material and second layers 1154 may exclude silicon nitride-based material and include oxide-based material, carbide-based material, elementary semiconductor material, metal nitride-based material, or a combination thereof. In some embodiments, first layers 1152 may include silicon nitride and second layers 1154 may include silicon, titanium nitride, titanium carbide, or tungsten carbide. In some embodiments, excluding silicon nitride and having elementary silicon in second layers 1154 may help to reduce the etched region in second layer 1154 indicated by dotted circle 1144. This etched region may be smaller than an etched region in second layer 1154 if silicon nitride is included in second layer 1154 because of higher etch selectivity of silicon compared to silicon nitride when etching oxide material of first and second ILD layers 236 and 246 during the formation of S/D contact structures 228 and 229.

In some embodiments, gate capping structures 1120* and 1120 may each have a total thickness He ranging from about 10 nm to about 70 nm. In some embodiments, first and second layers 1152 and 1154 may each have a thickness different from each other. In some embodiments, first and second layers 1152 and 1154 may each have a horizontal dimension (e.g., width) $Wc_1$ and $Wc_2$, respectively, substantially equal to each other. In some embodiments, each of $Wc_1$ and $Wc_2$ may be greater than a horizontal dimension (e.g., gate length) Lg of each of gate structures 108, 209, and 211. In some embodiments, each of $Wc_1$ and $Wc_2$ may be equal to or greater than 1.1 times of Lg. In some embodiments, Lg may range from about 5 nm to about 30 nm. Based on the disclosure herein, a person of ordinary skill in the art will recognize that other materials and thicknesses for gate capping structures 1120* and 1120 are within the scope and spirit of this disclosure.

Figure 12:
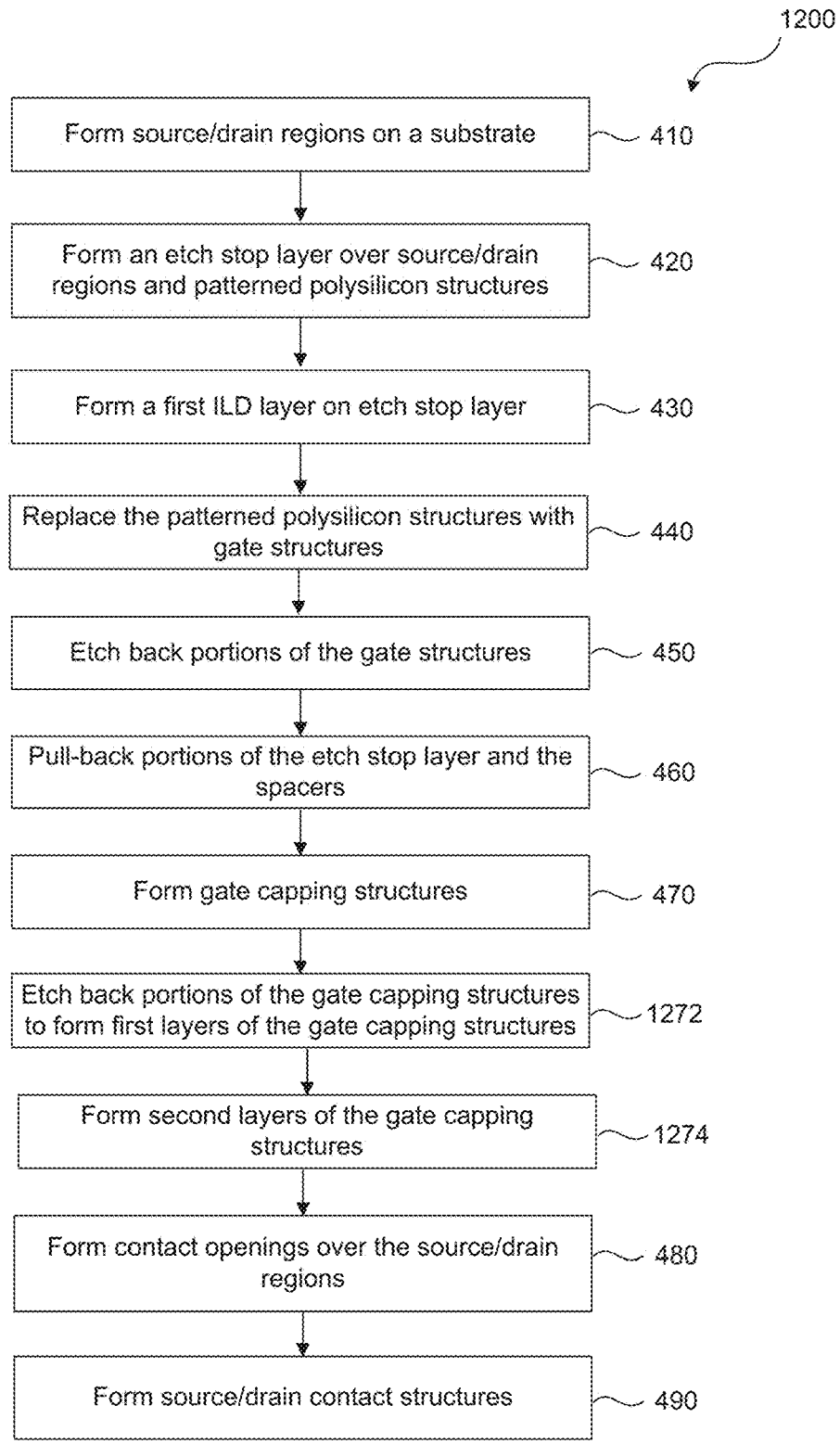
FIG. 12 is flow diagram of a method for fabricating a fin field effect transistor (finFET), in accordance with some embodiments.
Figure 13:
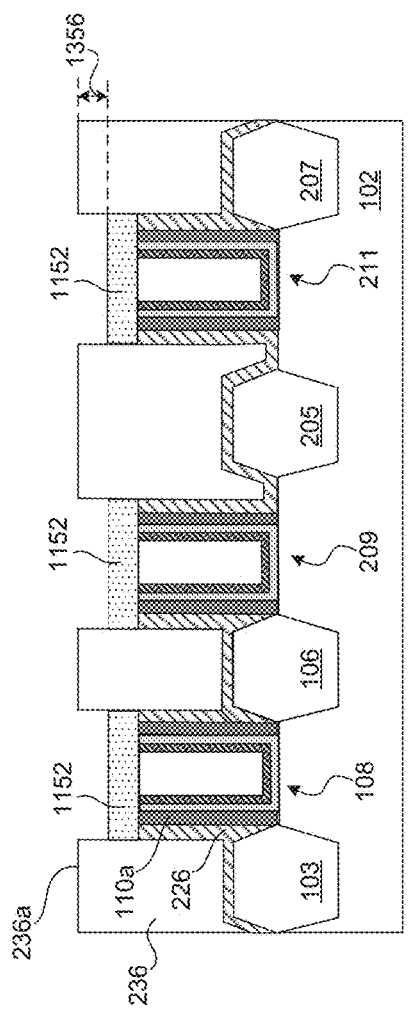
FIGS. 13-14 are cross-sectional views of a fin field effect transistor (finFET) at various stages of its fabrication process, in accordance with some embodiments.
Figure 14:
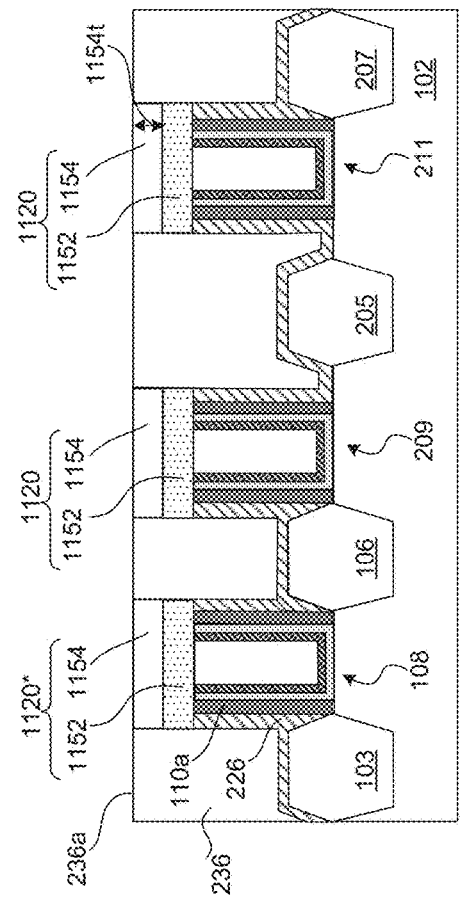

FIG. 12 is a flow diagram of an example method 1200 for fabricating finFET 100, according to some embodiments. Operations in FIG. 12 with the same annotations as operations in FIG. 4 are described above. For illustrative purposes, the operations 1272 and 1274 illustrated in FIG. 12 will be described with reference to the example fabrication process illustrated in FIGS. 13-14. FIGS. 13-14 are cross-sectional views of finFET 100 at various stages of its fabrication, according to some embodiments. Operations can be performed in a different order or not performed depending on specific applications. It should be noted that method 1200 does not produce a complete finFET 100. Accordingly, it is understood that additional processes may be provided before, during, and after method 1200, and that some other processes may only be briefly described herein.

Operation 1272 may be preceded by operations 410-470 as described in FIG. 4. In operation 1272, portions of the gate capping structures formed in operation 470 are removed to form first layers of gate capping structures. For example, as shown in FIG. 13, gate capping structures 120* and 120 may be etched back by a vertical dimension 1356 from top surface 236a to form first layers 1152 of gate capping structures 1120* and 1120. In some embodiments, vertical dimension 1356 may range from about 20 nm to about 40 nm. In some embodiments, first layers 1152 may each have a thickness ranging from about 5 nm to about 30 nm.

In some embodiments, the etch back process may be performed by a dry etch process, a wet process, or the cyclic etch/deposition described in operation 460 of FIG. 4. In some embodiments, the dry etch process may use a fluorine-based etchant. In some embodiments, the wet etch process may use phosphoric acid as an etchant.

In operation 1274, second layers of the gate capping structures are formed on the first layers. For example, as shown in FIG. 14, second layers 1154 may be formed on first layers 1152. The formation of second layers 1154 may include blanket deposition of the material for second layers 1154 on first layers 1152. The blanket deposition process may be performed by a suitable deposition process for insulating materials such as, for example, ALD, CVD or PECVD. A CMP process may be performed after the blanket deposition to coplanarize top surfaces of second layers 1154 with top surface 236a. In some embodiments, each of second layers may have a thickness 1154t ranging from about 5 nm to about 30 nm. In some embodiments, total thickness of each of gate capping structures 1120* and 1120 may range from about first layer 1152 may have a thickness ranging from about from about 10 nm to about 70 nm.

Operation 1274 may be followed by operations 480-490 as described in FIG. 4 to form the structure of FIG. 11.

Figure 15:
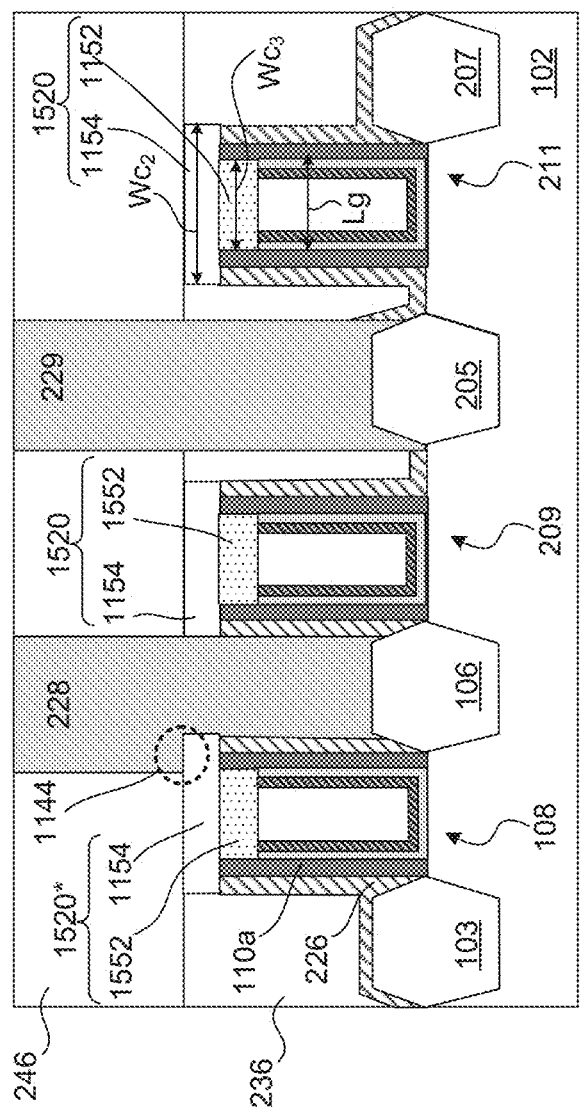
FIG. 15 is a cross-sectional view of a fin field effect transistor (finFET), in accordance with some embodiments.

FIG. 15 is another cross-sectional view along line A-A of finFET 100 of FIG. 1, according to some embodiments. Elements in FIG. 15 with the same annotations as elements in FIGS. 1-2 and 11 are described above. The above discussion of gate capping structures 120*, 120, 1120*, and 1120 applies to gate capping structure 1120* and 1120 unless mentioned otherwise. A person of ordinary skill in the art will recognize that the view of finFET 100 in FIG. 15 is shown for illustration purposes and may not be drawn to scale.

Similar to gate capping structures 120*, 120, 1120*, and 1120, gate capping structures 1520* and 1520 may be configured to protect ESL 226, spacers 110a, and gate structures 108, 209, and 211 during formation of S/D contact structures 228 and 229. Gate capping structures 1520* and 1520 may each include first and second layers 1552 and 1154. First and second layers 1552 and 1154 may be similar in composition to first and second layer 1152 and 1154 described with reference to FIG. 11. In some embodiments, top surfaces of first layers 1552 may be coplanar with top surfaces of ESL 226 and spacers 110.

In some embodiments, gate capping structures 1520* and 1520 may each have a total thickness similar to thickness He shown in FIG. 11. In some embodiments, first and second layers 1552 and 1154 may each have a thickness different from each other. In some embodiments, first and second layers 1552 and 1154 may each have a horizontal dimension (e.g., width) $Wc_3$ and $Wc_2$, respectively, where $Wc_2$ may be greater than $Wc_3$. In some embodiments, each of $Wc_2$ and $Wc_3$ may be greater than and substantially equal to, respectively, a horizontal dimension (e.g., gate length) Lg of each of gate structures 108, 209, and 211. In some embodiments, each of $Wc_2$ may be equal to or greater than 1.1 times of Lg. Based on the disclosure herein, a person of ordinary skill in the art will recognize that other materials and thicknesses for gate capping structures 1520* and 1520 are within the scope and spirit of this disclosure.

Figure 16:
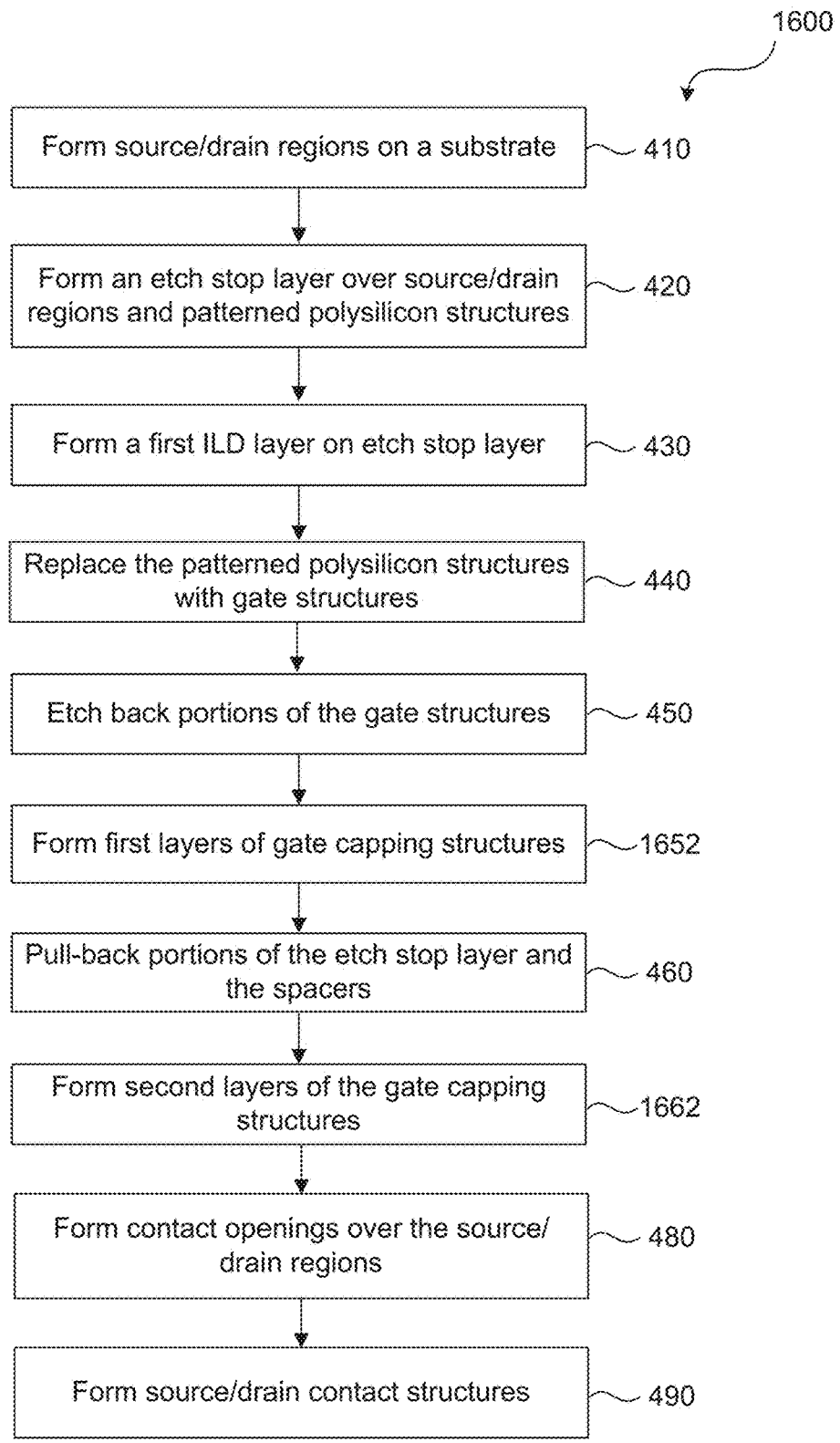
FIG. 16 is flow diagram of a method for fabricating a fin field effect transistor (finFET), in accordance with some embodiments.

FIG. 16 is a flow diagram of an example method 1600 for fabricating finFET 100, according to some embodiments. Operations in FIG. 16 with the same annotations as operations in FIG. 4 are described above. For illustrative purposes, the operations 1652 and 1662 illustrated in FIG. 16 will be described with reference to the example fabrication process illustrated in FIGS. 17-18. FIGS. 17-18 are cross-sectional views of finFET 100 at various stages of its fabrication, according to some embodiments. Operations can be performed in a different order or not performed depending on specific applications. It should be noted that method 1600 does not produce a complete finFET 100. Accordingly, it is understood that additional processes may be provided before, during, and after method 1600, and that some other processes may only be briefly described herein.

Operation 1652 may be preceded by operations 410-450 as described in FIG. 4. In operation 1652, first layers of gate capping structures are formed on the etched back gate structure of operation 450. For example, as shown in FIG. 17, first layers 1552 may be formed on gate structures 108, 209, and 211. The formation of first layers 1552 may include blanket deposition of the material of first layers 1552, a CMP process, and an etch back process. The blanket deposition process may be performed by a suitable deposition process for insulating materials such as, for example, ALD, CVD or PECVD. The CMP process may be performed after the blanket deposition to coplanarize top surfaces of first layers 1552 with top surface 236a. The planarized layer then may be etched back by a vertical dimension 1758 from top surface 236a to form first layers 1552 of gate capping structures 1520* and 1520. In some embodiments, vertical dimension 1758 may range from about 20 nm to about 40 nm. In some embodiments, first layers 1552 may each have a thickness ranging from about 5 nm to about 30 nm. The etch back process be performed by a dry etch process, a wet process, or the cyclic etch/deposition described in operation 460 of FIG. 4. In some embodiments, the dry etch process may use a fluorine-based etchant. In some embodiments, the wet etch process may use phosphoric acid as an etchant.

Operation 1662 may be preceded by operation 460 as described in FIG. 4. In operation 1662, second layers of the gate capping structures are formed on the first layers and pulled-back ESL and spacers. For example, as shown in FIG. 18, second layers 1154 may be formed on first layers 1552 and pulled back ESL 226 and spacers 110a. The formation of second layers 1154 is similar to that described in operation 1274 of FIG. 12.

Operation 1662 may be followed by operations 480-490 as described in FIG. 4 to form the structure of FIG. 15.

Based on the disclosure herein, a person of ordinary skill in the art will recognize that the above described gate capping structures 120, 120*, 1120, 1120*, 1520, and/or 1520 may be formed on gate structures of other FETs, for example, MOSFETs, which may have similar ILD layers 236, 246, etch stop layer 226, and S/D contact structures 228 229. The gate structures of other FETs may be formed on a substrate (e.g., substrate 102) and between S/D regions of other FETs.

The above embodiments describe structures and methods for protecting the structural integrity of insulating layers (e.g., spacers 110a and etch stop layer 226) on gate structures (e.g., gate structure 108) and consequently, preventing electrical shorting between gate structures (e.g., gate structure 108) and source/drain (S/D) contact structures (e.g., S/D contact structure 228) of a FET (e.g., MOSFET or finFET). Such embodiments provide larger gate protection area, during the formation of the S/D contact structures, compared to other FETs. The use of gate capping structures (e.g., gate capping structures 120*, 1120*, and 1520*) in these embodiments helps to overcome the challenges of etching narrow ILD layer regions during the formation of contact openings over S/D region. The problems associated with the etching of narrow ILD layer regions can be overcome by the gate capping structures without modifying the chemistry of etchants and/or adjusting the etch process parameters used in fabrication of other finFETs (e.g., finFET 100*), semiconductor devices, and/or integrated circuits. Some of the embodiments are described below.

In an embodiment, a method of forming a semiconductor device includes forming a source/drain region and spacers on a substrate. The method further includes forming an etch stop layer on the spacers and the source/drain region and forming a gate structure between the spacers. The method further includes etching back the gate structure, etching back the spacers and the etch back layer, and forming a gate capping structure on the etched back gate structure, spacers, and etch stop layer.

In a further embodiment, a method of forming a semiconductor device includes forming a source/drain region and spacers on a substrate. The method further includes forming a gate structure between the spacers and etching back the gate structure. The method further includes forming a first layer of a gate capping structure on the etched back gate structure, etching back the spacers, and forming a second layer of the gate capping structure on the first layer and the etched back spacers.

In a still further embodiment, a semiconductor device includes a source/drain region on a substrate, an interlayer dielectric (ILD) layer over the source/drain region, and a gate structure on the substrate. The semiconductor device further includes spacers positioned on opposing sides of the gate structure, an etch stop layer on sidewalls of the spacers, and a gate capping structure positioned within the ILD layer and on the gate structure, the spacers, and the etch stop layer. The gate capping structure has a width that is larger than a gate length of the gate structure.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a source/drain region on a substrate;
   forming spacers on the substrate;
   forming an etch stop layer on the spacers and the source/drain region;
   forming a gate structure between the spacers;
   etching back the gate structure;
   etching back, after the etching back of the gate structure, the spacers and the etch stop layer; and
   forming a gate capping structure on the etched back gate structure, spacers, and etch stop layer.

2. The method of claim 1, wherein the forming the gate capping structure comprises:
   depositing an insulating material on the etched back gate structure, spacers, and etch stop layer; and
   planarizing the insulating material.

3. The method of claim 1, wherein the forming the gate capping structure comprises:
   forming a first insulating layer on the etched back gate structure, spacers, and etch stop layer; and
   forming a second insulating layer on the first insulating layer.

4. The method of claim 1, wherein the forming the gate capping structure comprises:
   depositing a first insulating material on the etched back gate structure, spacers, and etch stop layer;
   etching back the first insulating layer;
   depositing a second insulating material on the etched back insulating layer; and
   planarizing the second insulating material.

5. The method of claim 1, wherein the etching back the spacers and the etch back layer comprises:
   a dry etch process; and
   an oxide deposition process.

6. The method of claim 1, wherein the etching back the spacers and the etch back layer comprises performing a dry etch process and an oxide deposition process in a cyclic manner repeated 1 to 10 times.

7. The method of claim 1, further comprising:
   forming an etch stop layer on the spacers;
   etching back the etch stop layer such that a top surface of the etch stop layer is coplanar with a top surface of the first layer.

8. The method of claim 4, wherein the etching back the first insulating layer comprises:
   a dry etch process; and
   an oxide deposition process.

9. The method of claim 4, wherein the etching back the first insulating layer comprises performing a dry etch process and an oxide deposition process in a cyclic manner repeated 1 to 10 times.

10. The method of claim 4, wherein the etching back the first insulating layer comprises performing a wet etch process using an etchant having phosphoric acid.

11. The method of claim 4, wherein the etching back the first insulating layer comprises performing a dry etch process using a fluorine-based etchant.

12. A method of forming a semiconductor device, the method comprising:
    forming a source/drain region on a substrate;
    forming spacers on the substrate;
    forming a gate structure between the spacers;
    etching back the gate structure;
    forming a first layer of a gate capping structure on the etched back gate structure;
    etching back, after the etching back of the gate structure, the spacers; and
    forming a second layer of the gate capping structure on the first layer and the etched back spacers.

13. The method of claim 12, wherein the forming the first layer comprises:
    depositing an insulating material on the etched back gate structure;
    planarizing the insulating material; and
    etching back the planarized insulating material.

14. The method of claim 12, wherein the forming the first layer comprises:
    depositing an insulating material on the etched back gate structure; and
    etching back the insulating material by performing a dry etch process and an oxide deposition process in a cyclic manner repeated 1 to 10 times.

15. The method of claim 12, wherein the forming the first layer comprises:
    depositing an insulating material on the etched back gate structure; and
    etching back the insulating material by performing a wet etch process using an etchant having phosphoric acid.

16. The method of claim 12, wherein the forming the first layer comprises:
    depositing an insulating material on the etched back gate structure; and
    etching back the insulating material by performing a dry etch process using a fluorine-based etchant.

17. The method of claim 12, wherein the forming the second layer comprises:
    depositing an insulating material on the first layer and the etched back spacers; and
    planarizing the insulating material.

18. A semiconductor device comprising:
    a source/drain region on a substrate;
    an interlayer dielectric (ILD) layer over the source/drain region;
    a gate structure on the substrate;
    spacers positioned on opposing sides of the gate structure;
    an etch stop layer on sidewalls of the spacers; and
    a gate capping structure positioned within the ILD layer and on the gate structure, the spacers, and the etch stop layer, wherein a width of the gate capping structure is larger than a gate length of the gate structure.

19. The semiconductor device of claim 18, wherein the gate capping structure comprises:
    a first insulating layer positioned on the gate structure, the spacers, and the etch stop layer; and
    a second insulating layer positioned on the first insulating layer, wherein:
    a width of the first insulating layer is equal to a width of the second insulating layer; and
    the widths of the first and second insulating layers are greater than the gate length of the gate structure.

20. The semiconductor device of claim 18, wherein the gate capping structure comprises:
    a first insulating layer positioned between the spacers and on the gate structure; and
    a second insulating layer positioned on the first insulating layer, the spacers, and the etch stop layer, wherein:
    a width of the first insulating layer is smaller than a width of the second insulating layer; and
    the width of the first insulating layer is equal to the gate length of the gate structure.

* * * * *

UNITED STATES PATENT AND TRADEMARK OFFICE
CERTIFICATE OF CORRECTION

PATENT NO. : 10,050,149 B1
APPLICATION NO. : 15/598717
DATED : August 14, 2018
INVENTOR(S) : Huang et al.

It is certified that error appears in the above-identified patent and that said Letters Patent is hereby corrected as shown below:

In the Specification

In Column 3, Line 65, delete "includes" and insert -- includes: --, therefor.

In Column 4, Line 45, delete "by" and insert -- by: --, therefor.

In Column 5, Line 26, delete "include" and insert -- include: --, therefor.

In Column 5, Line 29, delete "($Ta_2O_3$)" and insert -- $Ta_2O_5$ --, therefor.

In Column 6, Line 46, delete "having" and insert -- having: --, therefor.

In Column 10, Line 7, delete "We" and insert -- Wc --, therefor.

In Column 11, Line 62, delete "include" and insert -- include: --, therefor.

In Column 11, Line 65, delete "$Ta_2O_4$," and insert -- $Ta_2O_5$, --, therefor.

In Column 13, Line 36, delete "have" and insert -- have: --, therefor.

In Column 13, Line 51, delete "include" and insert -- include: --, therefor.

In Column 15, Line 20, delete "having" and insert -- having: --, therefor.

In the Claims

In Column 19, Line 42, Claim 7, delete "spacers;" and insert -- spacers; and --, therefor.

In Column 20, Line 36, Claim 18, delete "device" and insert -- device, --, therefor.

Signed and Sealed this
Twenty-eighth Day of May, 2019

Andrei Iancu
*Director of the United States Patent and Trademark Office*